June 3, 1952 P. C. MICHEL 2,599,271

AUDIO-FREQUENCY AMPLIFIER

Filed March 31, 1949

Inventor:
Philip C. Michel,
by Richard E. Hosley
His Attorney.

Patented June 3, 1952 2,599,271

UNITED STATES PATENT OFFICE 2,599,271

AUDIO-FREQUENCY AMPLIFIER

Philip C. Michel, Schenectady, N. Y., assignor to General Electric Company, a corporation of New York Application March 31, 1949, Serial No. 84,698

3 Claims. (Cl. 179—171)

Figure 1:
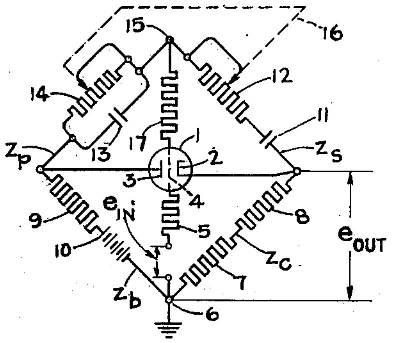

My invention relates to alternating current amplifiers and has for its principal object the provision of an alternating current amplifier particularly suitable for the amplification of single frequency alternating currents in the audio frequency range.

In many applications of audio frequency alternating current amplifiers, such as in metal detection systems, cardiographic systems, or in high fidelity measurement systems, it is highly desirable that the amplifier employed have sharp frequency selectivity and yet have good stability with respect both to selectivity and amplification. Most amplifiers which have heretofore been employed in these high fidelity audio frequency systems have utilized a combination of inductance and capacity to accomplish the tuning function. Due to the low efficiency, i. e., the high resistive component of inductive coils wound to resonate at low frequencies however, the resultant resonant circuit is of relatively poor frequency selectivity. If a regenerative type circuit is introduced to increase the selectivity of the amplifier, this regeneration, in turn, has the effect of appreciably reducing the stability characteristics of the amplifier with the result that such low frequency amplifiers are either of relatively poor selectivity or of relatively poor stability. It is an important object of my invention, therefore, to provide a low frequency amplifier which is both highly selective and stable.

In fulfillment of this latter object, it is an additional object of my invention to provide a low frequency amplifier in which the tuning function is accomplished without the use of an inductive element.

It is a further object of my invention to provide a highly selective audio frequency amplifier which is of simple economical construction and which utilizes commercially available component parts.

In general, my invention comprehends an amplifier including a bridge-type feedback circuit in which the source of alternating bridge voltage is developed across a pair of impedance elements arranged to form adjacent arms of the bridge and producing a pair of amplified voltages one of which varies in phase with the signal voltage and the other of which varies in opposition thereto. Tuning is accomplished by a series resistance-capacity network and a parallel resistance-capacity network connected in series opposition as the balancing pair of adjacent arms of the bridge. The impedance ratio of these resistance-capacity networks is adjusted to balance the bridge at the frequency of the input signal. A fraction of the voltage developed between the balanced points of the bridge at all other frequencies is degeneratively superimposed upon the signal voltage greatly to reduce the gain of the amplifier at all frequencies remote from the signal frequency.

In a preferred embodiment of my invention, the magnitudes of the impedance elements comprising the bridge circuit are chosen to cause the bridge to be balanced when the resistance in the resistance-capacity networks is equal to the capacitive reactance therein at the signal frequency.

Figure 3:
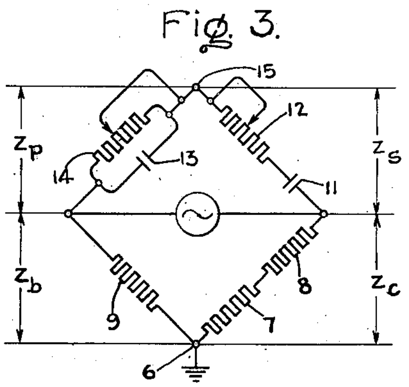
Figure 4:
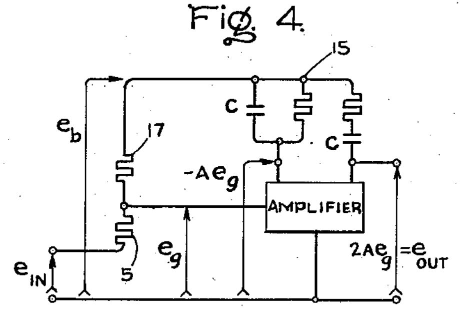
Figure 5:
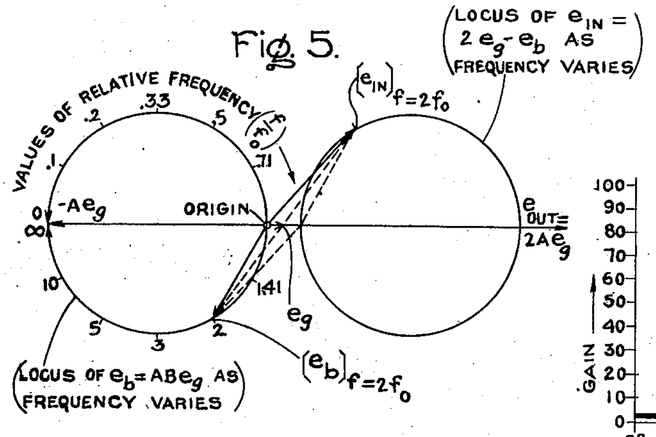
Figure 6:
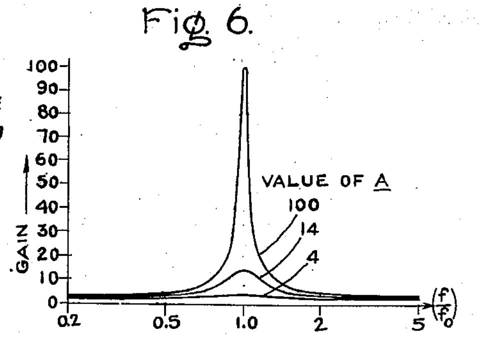
Figure 7:
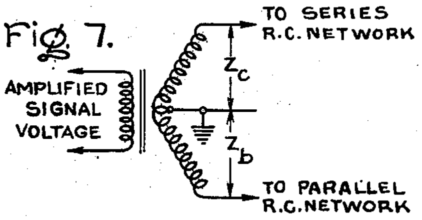

The novel features which I believe to be characteristic of my invention are set forth with particularity in the appended claims. My invention itself, however, together with further objects and advantages thereof can best be understood by reference to the following description taken in connection with the accompanying drawing in which Fig. 1 is a circuit diagram of an amplifier embodying one basic form of my invention, Fig. 2 is a circuit diagram of a modification of the basic amplifier of Fig. 1 incorporating certain improvements of my invention permitting much greater amplification and selectivity, Fig. 3 is a simplified bridge diagram explanatory of the operation of the tuning arrangement of the amplifiers illustrated in Figs. 1 and 2, Fig. 4 is a schematic diagram useful in the explanation of the operation of the circuit of Fig. 2, Fig. 5 is a representative vector diagram of the degenerative feedback voltage produced in the circuit of Fig. 2 for relative frequencies remote from the resonant frequency, Fig. 6 is a group of curves illustrating the selectivity of the amplifier of Fig. 2 as a function of amplifier gain, and Fig. 7 is a modification illustrating a further arrangement for obtaining the proper bridge voltages.

Figure 2:
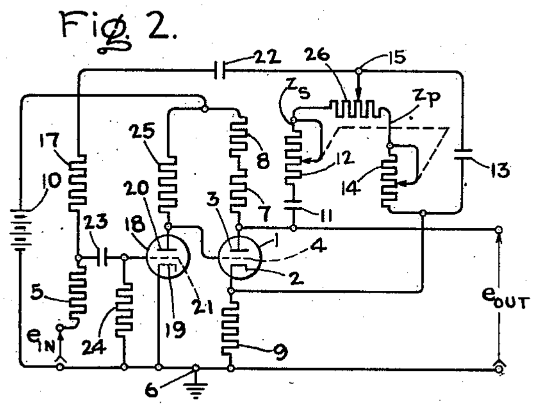

Referring to Fig. 1, I have shown one embodiment of my invention in the form of a bridge type circuit in which an electric discharge device 1, having a cathode 2, an anode 3 and a controlling electrode 4, is its central and controlling element. An alternating signal voltage, $e_{in}$, is applied to control electrode 4 through a high impedance element 5. The anode to cathode direct current circuit of the discharge device 1 is connected in series opposition to form a pair of impedance networks $Z_c$ and $Z_b$ from a common connection conductor represented by grounded point 6 to the cathode 2 and the anode 3 respectively. The cathode impedance network $Z_c$ preferably comprises a pair of resistive elements 7 and 8 connected in series, while the anode impedance network $Z_b$ preferably includes a resistive element 9 connected in series with a source of unidirectional current such as a battery 10.

While not imperative to the operation of my invention, it is highly desirable for reasons to be subsequently explained that the alternating current impedance of the cathode network $Z_c$ be equal to exactly twice the alternating current impedance of the anode network $Z_b$ so that the uninverted alternating voltage developed at the cathode 2 is equal to twice the inverted alternating anode voltage. In the instant embodiment, this may be easily accomplished by employing resistors 7, 8 and 9 whose values are mutually equivalent.

The tuning function of the amplifier is accomplished by a series resistance-capacity network $Z_s$ including a capacitor 11 and a variable resistor 12, and a parallel resistance-capacity network $Z_p$, including a capacitor 13 and a variable resistor 14, connected in series opposition from a second common connection conductor represented by balance point 15 to the cathode 2 and the anode 3 respectively. In order to minimize tuning fluctuations due to varying external conditions, capacitors 11 and 13 are preferably of equal magnitude and identical construction, and resistors 12 and 14 are also preferably of equivalent value and may be ganged to vary together as indicated by the dashed lines 16.

Degenerative feedback from balance point 15 to the control electrode 4 is accomplished through a high impedance element 17 which, together with the high impedance element 5, functions as a voltage dividing circuit to impress a fraction of the voltage developed between points 6 and 15 upon the control electrode 4.

Referring to Fig. 2, I have illustrated a modification of my invention whereby I obtain greater amplification and other advantages. A second electric discharge device 18 having a cathode 19, an anode 20 and a controlling electrode 21 is connected as a phase inverting amplifier between the input signal voltage $e_{in}$ and the controlling electrode 4 of discharge device 1. A first direct current blocking capacitor 22 is included between point 15 and the high impedance element 17, and a second direct current blocking capacitor 23 is interposed between the point of connection of high impedance element 17 to high impedance element 5 and the control electrode 21. These capacitors serve to prevent any direct current component of the signal voltage from undesirably affecting the operation of the amplifier. A direct current return resistor 24 is also included between the controlling electrode 21 and the cathode 19. A load resistor 25 and battery 10 are connected in series from the anode 20 to the cathode 19, and the amplified inverted signal voltage produced at anode 20 is directly coupled to the controlling electrode 4 of discharge device 1.

Because of the phase inversion caused by the additional stage of amplification, it is necessary that the position of the balancing arms of the bridge be interchanged if the proper phase relation of the feedback voltage is to be maintained. Therefore, load impedance element 9 is connected from the cathode 2 in Fig. 2 instead of from the anode 3 as indicated in Fig. 1; while the impedance elements 7 and 8 are serially connected from the anode 4 in Fig. 2 instead of from the cathode 2 as illustrated in Fig. 1. Similarly, the series resistance-capacity network $Z_s$ is connected to the anode 3 instead of the cathode 2 while the parallel resistance-capacity network $Z_p$ is connected to the cathode 2 instead of the anode 3.

In order to equalize the magnitudes of resistance in the resistance-capacity networks throughout the tuning range, I also, preferably, include a potentiometer 26 connected in series between resistor 12 and resistor 14 and having its movable tap connected to the balance point 15. In all other respects, the circuit of Fig. 2 is identical to that of Fig. 1.

The operation of my invention may best be understood by reference to the basic circuit of my invention illustrated in Fig. 1 taken in conjunction with the simplified bridge diagram illustrated in Fig. 3. Referring to Fig. 1, a varying signal voltage $e_{in}$ is applied between the controlling electrode 4 and point 6 through the high impedance element 5. Due to the consequent current variation in the anode to cathode circuit, a varying voltage is produced between cathode 2 and point 6 which is in phase with the signal voltage, while a varying voltage 180° out of phase therewith is produced between the anode 3 and point 6. The relative magnitudes of these opposing voltages is, of course, dependent upon the impedance ratio of the impedance networks across which they are developed. The actual magnitude of these voltages, however, is a function of the signal voltage, the amplification of the stage, and the amount and phase relation of the feedback voltage superimposed upon the signal voltage through the resistance-capacity networks $Z_s$ and $Z_p$.

As best seen in Fig. 3, these resistance-capacity networks $Z_s$ and $Z_p$ are arranged to form the balancing arms of a "Wein bridge" circuit with the cathode $Z_c$ and the anode $Z_b$ impedance networks. In order to tune the circuit to the signal frequency, it is only necessary to adjust the relative values of resistive elements 12 and 14 until the bridge is balanced for that frequency so that no current flows through the voltage dividing impedances 17 and 5 (shown in Fig. 1) connected between the balancing points 15 and 6. It will be understood, of course, that although, I preferably obtain adjustment of the resonant frequency by varying the value of the resistive components in these networks, the same result can be alternately achieved by varying the capacitance alone or both the capacitance and the resistance in each network.

The only limitation which must be observed for the proper operation of my invention is that the values of resistance and capacitance be so chosen that the resistance in each resistance-capacity network is equal to the capacitive reactance therein when the bridge is balanced at a particular frequency. When this is the case, it will be appreciated that the voltage developed between the balance points 15 and 6 for all frequencies remote from the resonant frequency will be 180° out of phase with the signal voltage. For frequencies above the signal frequency, the impedance of the series network $Z_s$ approaches the value of the included resistive element 12 while the impedance of the parallel network $Z_p$ approaches zero, with the result that the phase inverted voltage applied to the parallel network determines the direction of the current flow through the voltage dividing network connected between the balance points 15 and 6. For frequencies below the resonant frequency, the impedance of the series network $Z_s$ approaches an infinite value while the impedance of the parallel network approaches the value of the included resistive element 14 with the result that the phase of the voltage applied to the parallel network again determines the direction of current flow between the balance points 15 and 6. As a consequence, the voltage fed back to the controlling electrode 4 for all frequencies off resonance is degenerative in character.

This phenomena may be easily understood by considering the circuit conditions when the impedance ratio between adjacent arms of the bridge is 2—1, i. e., when the impedance of the cathode networks $Z_c$ is twice the anode network $Z_b$. For this particular operating condition the bridge is balanced when the capacitor 11 is constructed to equal the capacitor 13, the value of resistor 12 is adjusted to equal the capacitive reactance of the capacitor 11 at the signal frequency, and the value of resistive element 14 is adjusted to equal the capacitive reactance of capacitor 13 at the signal frequency.

For this operating condition, the impedance of the series resistance-capacity network is given the formula $$Z_s=r_s\left[1-j\frac{f_o}{f}\right]$$

and the impedance of the parallel resistance-capacity network $Z_p$ may be found from the formula:

$$Z_p=\frac{r_p\left[1-j\frac{f}{f_o}\right]}{\left[1+\left(\frac{f}{f_o}\right)^2\right]}$$

where $r_s$ is the resistance in the series branch, $r_p$ is the resistance in the parallel branch, and $f/f_o$ is the ratio of any frequency remote from the resonant frequency to the resonant frequency.

For the condition of resonance where $$\frac{f}{f_o}=1;\ r_s=r_p=\frac{1}{2\pi f_o c}$$

$$\frac{Z_s}{Z_p}=\frac{2[1-j]}{[1-j]}=\frac{2}{1}$$

and the bridge is balanced since $$\frac{Z_c}{Z_b}=\frac{2}{1}$$

When the values of the high impedance elements 17 and 5 are equal and are much greater than the values of resistive elements 12 or 14 which, in turn, are much greater than the load impedance elements 7, 8 or 9, the overall gain of the amplifier is given by the formula $$\frac{e_{out}}{e_{in}}=\frac{A}{1-\frac{A}{2}B}$$

where $e_{out}$ is the output voltage, $e_{in}$ is the input signal, A is the amplification factor of the stage and B is the feedback factor which is given by the formula:

$$B=\frac{2Z_p-Z_s}{Z_p+Z_s}$$

The operation of the embodiment of my invention illustrated in Fig. 2 is substantially similar to that of Fig. 1 with the exception of the additional gain resulting from the additional phase inverting stage of amplification.

Referring to Fig. 4, I have shown a schematic diagram of the amplifier of Fig. 2, in which I have defined the various voltages vectorially represented in Fig. 5. The gain of the amplifier of Fig. 2 for various frequencies off resonance can be computed by assuming a constant amplitude of voltage $e_g$ applied to grid 21 of tube 18 in order to give a constant output voltage, $e_{out}$, and by drawing them both as real vectors from an origin representing ground. As illustrated in Fig. 5 for the case wherein the amplification factor, A, of the amplifier is equal to 14, the locus of the feedback voltage $e_b$ developed between points 15 and 6 of the bridge circuit for various frequency ratios $f/f_o$, becomes a circle whose diameter is equal to the amplification factor A multiplied by the grid voltage $e_g$. Because of the voltage dividing circuit comprising equal resistors 17 and 5, the signal voltage $e_{in}$ is equal to twice the grid voltage $e_g$ minus the feedback voltage $e_b$; and the locus of $e_{in}$, as illustrated in Fig. 5, becomes a similar circle spaced $2e_g$ away with its frequency scale rotated 180°. The vector, $e_{in}$, is shown for a frequency ratio of two, $f/f_o=2$, and the ratio of output to input voltage for this example is approximately 3.8 at 50 degrees lag in contrast with an overall gain of 14 at resonance.

The control of selectivity afforded by adjustment of the value of the amplification factor A is illustrated in Fig. 6 by three gain vs. relative frequency curves for A=4, 14, and 100 respectively.

As will be readily appreciated from an inspection of the curves of Fig. 6, with a high amplification factor A, a slight deviation away from the resonant frequency causes a relatively large degeneration of the overall amplification. With modern high gain electronic tubes, amplification factors far greater than 100 are easily obtainable with the result that an amplifier embodying my invention can be made highly selective. Although many other combinations may be employed, extremely stable amplification is achieved by employing identical capacitors 11 and 13, identical resistors 12 and 14 and identical impedance elements 7, 8 and 9 to produce a constantly balanced resonant condition of the bridge regardless of the ambient changes in temperature or other external influences. It will also be appreciated that an amplifier such as described above is easily and economically constructed from commercially available components and can be aligned with a minimum of test equipment.

Although I have shown a particular embodiment of my invention in which I utilize the anode to cathode circuit of an electric discharge device in order to obtain the pair of amplified opposing voltages applied to the resistance capacity networks, many other circuit arrangements to obtain these opposing voltages will occur to those skilled in the art. One such arrangement, as illustrated in Fig. 7, is to utilize a transformer driven by a stage of amplification and having each half of its tapped secondary winding respectively connected to the resistance-capacity networks.

It is to be understood that I do not wish to be limited to the particular embodiment which I have illustrated and that I intend, by the appended claims to cover all modifications as fall within the true spirit and scope of my invention.

What I claim as new and desire to secure by Letters Patent of the United States is:

1. An alternating current amplifier circuit comprising a first conductor, an electric discharge device having a cathode, an anode, and a discharge controlling electrode, means to apply between said first conductor and said controlling electrode a voltage derived from an alternating voltage signal to be amplified, a first impedance network connected from said cathode to said first conductor, a second impedance network including a source of unidirectional voltage and connected between said anode and said first conductor whereby a voltage is produced in one of said impedance networks varying in phase with the signal to be amplified and a voltage is produced in the other impedance network varying 180 degrees out-of-phase therewith, a second conductor, a series resistance-capacity network connected from said second conductor to the in-phase voltage producing impedance network, a parallel resistance-capacity network connected from said second conductor to said 180 degree out-of-phase voltage producing impedance network, means to adjust the relative impedance of the two resistance-capacity networks at a desired frequency component of a signal voltage to produce a zero voltage at said frequency between said first and second conductors, the components of said resistance-capacity networks being so chosen that the resistance in each network is equal to the capacitive reactance therein at said frequency when the circuit is in said first-to-second conductor zero voltage condition, and means to superimpose degeneratively upon a signal voltage a fraction of the voltage developed between said first and second conductors at all other frequencies.

2. An alternating current amplifier circuit comprising an electric discharge device having a cathode, an anode, and at least one discharge controlling electrode, a first common connection conductor, a first impedance network connected from said cathode to said first conductor, a second impedance network including a source of unidirectional voltage and connected from said anode to said first conductor, said first impedance network having twice the impedance of said second impedance network, a second common connection conductor, a series resistance-capacity network connected from said cathode to said second conductor, a parallel resistance-capacity network connected from said anode to said second conductor, means to impress an alternating signal voltage between said controlling electrode and said first conductor, means to deliver a fraction of the voltage developed between said first and second conductors to said controlling electrode, and means to equalize the ohmic magnitude of the resistance and capacitive reactance in both said resistance-capacity networks at a frequency component of a signal voltage to balance the voltages of said frequency on said first and second conductors to tune the amplifier circuit to said frequency.

3. An alternating current amplifier circuit comprising an electric discharge device having a cathode, an anode, and at least one discharge controlling electrode, a first common connection conductor, a first impedance network connected from asid cathode to said first conductor, a second impedance network including a source of unidirectional voltage and connected from said anode to said first conductor, said first impedance network having twice the impedance of said second impedance network, a second common connection conductor, a series resistance-capacity network connected from said anode to said second conductor, a parallel resistance-capacity network connected from said cathode to said second conductor, means including a phase inverting amplifier to couple a varying signal voltage to said controlling electrode, means to superimpose degeneratively upon a signal voltage a fraction of the voltage developed between said first and second conductors, and means to equalize the ohmic magnitude of the resistance and capacitive reactance in both said resistance-capacity networks at a frequency component of a signal voltage to balance the voltages of said frequency on said first and second conductors to tune the amplifier circuit to said frequency.

PHILIP C. MICHEL.

REFERENCES CITED

The following references are of record in the file of this patent:

UNITED STATES PATENTS

| Number | Name | Date |
|---|---|---|
| 2,173,426 | Scott | Sept. 19, 1939 |
| 2,372,419 | Ford | May 27, 1945 |
| 2,382,097 | Purington | Aug. 14, 1945 |
| 2,411,706 | Berkoff | Nov. 26, 1946 |
| 2,488,567 | Stodola | Nov. 22, 1949 |